United States Patent [19]

Geller et al.

[11] Patent Number: 5,063,177

[45] Date of Patent: Nov. 5, 1991

[54] METHOD OF PACKAGING MICROWAVE SEMICONDUCTOR COMPONENTS AND INTEGRATED CIRCUITS

[75] Inventors: Bernard D. Geller, Rockville; Johann U. Tyler, Mt. Airy; Louis B. Holdeman, Boyds; Fred R. Phelleps, Gaithersburg; George F. Laird, III, Baltimore, all of Md.

[73] Assignee: COMSAT, Washington, D.C.

[21] Appl. No.: 592,750

[22] Filed: Oct. 4, 1990

[51] Int. Cl.⁵ .................................................. H01L 21/60
[52] U.S. Cl. ................................. 437/209; 437/214; 437/215; 437/219; 437/974; 437/180; 357/72; 357/74; 357/80; 357/81
[58] Field of Search ............... 437/209, 214, 215, 219, 437/974, 203, 212, 180, 205, 207; 357/72, 80, 81, 74

[56] References Cited

U.S. PATENT DOCUMENTS

| | | | |
|---|---|---|---|
| 4,026,759 | 5/1977 | McBride et al. | 437/215 |
| 4,030,943 | 6/1977 | Lee et al. | 437/59 |
| 4,199,777 | 4/1980 | Maruyama et al. | 357/71 |
| 4,442,590 | 4/1984 | Stockton et al. | 437/201 |
| 4,465,549 | 8/1984 | Ritzman | 437/974 |
| 4,483,067 | 11/1984 | Parmentier | 437/209 |
| 4,684,965 | 8/1987 | Tajima et al. | 437/8 |
| 4,706,374 | 11/1987 | Murakami | 437/170 |
| 4,784,970 | 11/1988 | Solomon | 437/974 |
| 4,789,645 | 12/1988 | Calviello et al. | 437/195 |
| 4,794,093 | 12/1988 | Tone et al. | 437/974 |
| 4,807,022 | 2/1989 | Kazior et al. | 437/203 |
| 4,859,629 | 8/1989 | Reardon et al. | 437/974 |
| 4,956,697 | 9/1990 | Kobiki et al. | 357/81 |
| 5,006,487 | 4/1991 | Stokes | 437/974 |

FOREIGN PATENT DOCUMENTS

| | | | |
|---|---|---|---|
| 352183 | 1/1990 | European Pat. Off. | 437/209 |
| 54-00974 | 1/1979 | Japan | 437/209 |
| 54-116888 | 9/1979 | Japan | 437/974 |
| 54-155770 | 12/1979 | Japan | 437/974 |
| 60-214536 | 10/1985 | Japan | 437/974 |

Primary Examiner—Brian E. Hearn
Assistant Examiner—Kevin Picardat
Attorney, Agent, or Firm—Sughrue, Mion, Zinn, Macpeak & Seas

[57] ABSTRACT

Integration and packaging of monolithic microwave integrated circuits (MMIC) components is facilitated by using a motherboard comprising high resistivity silicon, which having a thermal conductivity three times that of gallium arsenide. Ultra high purity, uncompensated silicon preferably is used. Anisotropic etching of recesses in the motherboard facilitates precise placement of the MMICs in the recesses, enabling use of automated die and wire bonding techniques to reduce required assembly time substantially. Using a silicon motherboard also ultimately enables incorporation of required control circuitry. The silicon motherboard also transmits RF energy well, a useful characteristic particularly in C-band and X-band applications in which microstrip is used, though other transmission media function well at even higher frequencies.

15 Claims, 2 Drawing Sheets

METHOD OF PACKAGING MICROWAVE SEMICONDUCTOR COMPONENTS AND INTEGRATED CIRCUITS

BACKGROUND OF THE INVENTION

The present invention relates to the packaging of integrated circuits, and in particular to the packaging of monolithic microwave integrated circuits (MMICs) to effect energy transmission at RF frequencies.

Various conventional integration and packaging techniques are known for packaging integrated circuits on substrates. For the most part, these substrates have been either ceramic or metal/ceramic, as shown in U.S. Pat. Nos. 4,780,572 and 3,934,336.

Packaging of MMICs presents a variety of problems. One problem relates to heat dissipation. Another problem relates to the ability of a substrate on which the MMICs are mounted to act as a suitable transmission medium at RF frequencies. Yet another problem relates to difficulties in substrate fabrication, relative to both die bonding of MMICs within recesses in a motherboard, and wire bonding to effect proper electrical connections.

The above-mentioned patents do not disclose the packaging of MMICs on substrates per se, and thus are silent regarding MMIC-specific considerations. However, these patents are exemplary of the types of substrates used to package MMICs.

U.S. Pat. No. 4,199,777, also unrelated to MMIC packaging per se, teaches, in one embodiment, the use of a silicon substrate or motherboard on which semiconductor devices are placed. However, there is no mention of the use of the substrate as a transmission medium for energy at any particular frequency. At most, the substrate might act as a transmission medium for energy at digital or low frequencies, but such certainly is not specifically stated. Further, the placement of semiconductor devices in etched recesses in the substrate is effected by provision of a conformal material which fills in gaps in the recesses. Still further, the silicon substrate disclosed is intended to perform an active function with respect to circuit operation.

None of the prior art of which the inventors are aware uses a silicon motherboard as a passive element, for transmission of energy at RF frequencies. Further, it would be desirable to have a substrate which can be etched so as to facilitate placement and positioning of MMICs, enabling the use of automated die and wire bonding techniques.

SUMMARY OF THE INVENTION

In view of the foregoing, it is one object of the invention to provide a packaging and integration technique for MMICs in which the motherboard on which the MMICs are placed is used as a transmission medium for transmitting energy at RF frequencies.

It is another object of the invention to provide a packaging technique which enables the use of automated die and wire bonding techniques, to speed up production of MMIC packages.

To achieve the foregoing and other objects, the invention employs a silicon motherboard (SMB) of high resistivity silicon, preferably at least 10 kΩ-cm, and having a <100> crystal orientation so that etching can be effected in the <111> plane of the silicon. Silicon has three times the thermal conductivity of gallium arsenide (GaAs) and over four times that of alumina, of which MMIC packages often are made. As a result, by using a silicon motherboard and placing GaAs MMICs thereon, thermal conductivity is enhanced.

Properly treated silicon has far higher surface quality, and better thermal conductivity characteristics than does alumina, which was used previously. However, one difficulty has been that, in preparing the silicon to receive the MMICs and other circuit elements, the treatment processes removed the favorable silicon characteristics. Thus, an important aspect of the invention is the treatment of the high resistivity silicon itself, so as to preserve the favorable characteristics of the silicon as a low RF loss transmission medium, while etching the necessary recesses and vias in the silicon to enable placement of the MMICs and other circuit elements.

In the approach of the invention, MMICs, field effect transistors (FETs), dielectric resonators, and other components are bonded to a low loss silicon substrate which contains etched recesses for MMIC chips and devices, vias, and monolithic overlay capacitors, resistors, air bridges, and other typical MMIC components and structures. The silicon acts as transmission medium, chip carrier, and heat conductor. This triple function is in contrast to prior approaches which use the substrate primarily as a chip carrier, and perhaps as a heat conductor. The integrated structure of the invention requires far fewer manual assembly operations than conventional approaches, and exhibits fewer discontinuities, thus reducing cost and improving reliability, reproducibility, and performance.

The function of the invention as a transmission medium is particularly facilitated at C-band and X-band frequencies in a microstrip environment. In other environments, such as coplanar waveguide, the inventive packaging techniques should enable effective transmission at millimeter frequencies (i.e. up to 94 GHz).

DETAILED DESCRIPTION OF THE PREFERRED EMBODIMENT

Some of the advantages of silicon over alumina were summarized above. One result of the superior surface quality, or mirror quality of silicon, is that the transmission lines for the MMICs do not have to traverse so rough a surface as is the case with an alumina substrate, which is much rougher. Thus, the transmission lines on the silicon substrate are not nearly so lossy. Also, it is possible to achieve a much higher yield for monolithic elements such as capacitors because the dielectric for those capacitors is placed on a much smoother surface.

Also, as will be apparent from the following discussion, silicon is conducive to chemical etching techniques, which are much faster and more accurate than physical machining techniques such as drilling and lasing. Chemical etching techniques are not possible on alumina, which thus requires drilling or lasing to form vias and recesses.

Although the SMB described herein uses microstrip transmission lines, coplanar waveguide and finline transmission structures also can be accommodated easily. The microstrip or coplanar waveguide SMB may be incorporated into suitable RF packages by attaching the substrate to the package base prior to MMIC/device attachment. Various attachment techniques, including eutectic bonding and epoxying, may be used, though the invention is not limited to these particular examples. Additional performance and reliability improvement (compared to fully monolithic realizations) is obtained in the case of power amplifiers because thinner partially-matched or discrete chips may be used, thus resulting in better heat removal, together with lower RF loss.

Figure 1:
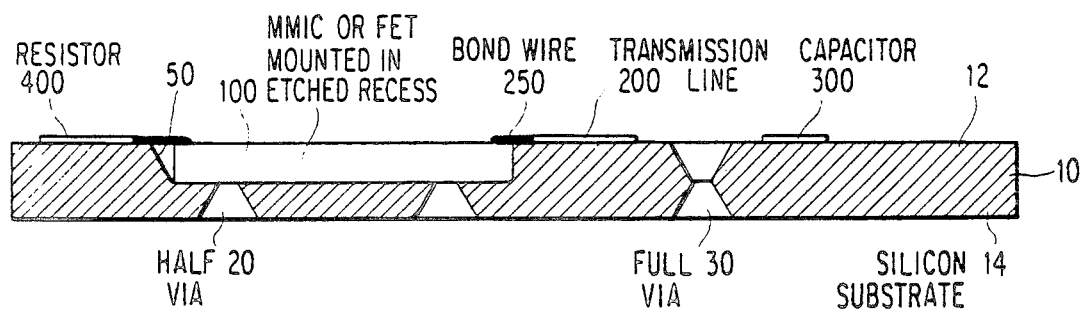
FIG. 1 shows a schematic cross-section of a silicon motherboard, and depicting a packaging technique according to the invention.

FIG. 1 shows a schematic cross-section of an SMB, and depicts the results of the fabrication techniques according to the present invention. A silicon substrate 10 preferably is of a <100> crystal orientation, permitting anisotropic etching of recesses 50 along the <111> plane of the silicon, in a first major surface 12 of that substrate 10. The substrate 10 is made of high resistivity silicon, preferably exceeding 8 k$\Omega$-cm, more preferably exceeding 10 k$\Omega$-cm. Silicon having a resistivity below 8 k$\Omega$-cm is ineffective for transmission at RF frequencies. At present, silicon with a resistivity above 25 k$\Omega$-cm is not commercially available, though of course it is not possible to predict what may be available in the future. It suffices to state that silicon having a resistivity between 8 and 25 k$\Omega$-cm presently is preferred.

The silicon which is to be used in the SMB of the invention should be of ultra high purity, and uncompensated, i.e. having no atoms substituted into the silicon to provide high resistivity characteristics. Using lower purity, compensated silicon will not be effective because, when the silicon undergoes the necessary processing steps, the compensating atoms will tend to travel, migrating particularly to the major surfaces, and causing electronic irregularities in those surfaces, making the surfaces more lossy.

By anisotropically etching the recesses 50 in the major surface 12 of substrate 10, the sidewalls of the recesses can be tapered, thereby facilitating more accurate placement of MMICs or FETs 100 in the etched recesses, in contrast to prior techniques, and thus permitting the use of automated die bonding and wire bonding techniques which require accurate knowledge of device placement in order to be effective.

The effectiveness of having tapered sidewalls may be contrasted to prior efforts as follows. For example, placing the MMICs on a planar surface is difficult to do accurately, because there are no physical guides for confining the MMICs. Providing recesses in an alumina substrate, which must be done using physical techniques such as lasing or drilling, cannot be done readily to provide tapered sidewalls. Without tapered sidewalls, the bottoms of the recesses have the same dimensions as the tops. As a result, the recesses must necessarily be larger in length and width than the MMICs themselves. In contrast, with tapered sidewalls, the bottom dimensions of the recesses may match those of the MMICs quite exactly, with the tapering of the walls providing the necessary freedom of movement of the MMICs during positioning.

The MMICs or FETs 100 are formed of GaAs, having a thermal conductivity one-third of that of the silicon substrate 10. Thus, the substrate 10 can conduct heat away from the MMICs and FETs effectively.

As also shown in FIG. 1, half vias 20 and full vias 30 are etched in the substrate 10. While a range of substrate thicknesses are possible, in the preferred embodiment the substrate 10 has a thickness of 10 mils, so that the half vias 20, preferably extending halfway through the substrate, are 5 mils deep, and the full vias 30, extending all the way through the substrate 10, preferably are 10 mils in length. Metalization is provided along the sidewalls of the vias. The half vias 20 connect the metalized bottom of the device recesses 50 with the SMB ground plane which extends beneath the major surface 14 of the silicon substrate 10. The effect of the inductance of these ground-to-ground vias can be made negligible through the use of multiple vias, or through placement of the vias at relatively high impedance points.

The anisotropic etching of the vias and device recesses is carried out using thermally grown silicon dioxide as the etch mask. A proprietary reflux etching system maintains the etchant concentration and temperature necessary to obtain smooth, flat surfaces at the bottom of the device recesses, and to control etch times for a correct profile of the front-to-back vias 30. An infrared mask liner is used to achieve proper front-to-back alignment. Parallel plate capacitors are patterned around a silicon nitride dielectric, which also is used as protection under air bridges. Surface damage arising from the use of reactive ion etching for the dielectrics and resistor material necessitated the development of an amorphous silicon interface layer for the SMB. This layer prevents the formation of a lossy inversion layer, and serves as the underlying passivation layer.

Standard photolithography techniques may be used to allow fine line patterning on the etched surfaces of the SMB. The use of thicker photoresists, as is preferred, can minimize the problems of edge build-up, and can allow processing to follow an automated production mode.

The fabrication process for the SMB is an important aspect of the invention, as it allows the preservation of the favorable characteristics which make high purity, high resistivity silicon an attractive alternative to alumina and other substances. The process is as follows:

1. Thermal oxidation of the major surfaces of the silicon is carried out at high temperature (>1000° C.) in a wet atmosphere to achieve an oxide thickness of 9500 Å±500 Å.
2. A 5000 Å gold film is sputtered onto the back oxide surface, opposite that in which the device recesses will be placed, in order to cover and protect the back surface of the silicon wafer during etching of the front oxide surface.
3. The front oxide surface is etched selectively, using photolithographic techniques, to open up areas on the front surface and allow etching of the silicon device recesses and vias.
4. The front surface then is etched to form the device recesses and vias. The wafer is placed in a solution of KOH and water at a temperature of approximately 85° C. in a reflux etching system, and is etched to a depth of one-half the thickness of the wafer. In the illustrated embodiment, the wafer is 10 mils thick, so this step etches recesses and vias which are substantially 5 mils thick.
5. A thin layer of amorphous silicon is deposited on the entire front surface, and is covered with a plasma enhanced chemical vapor deposited (PECVD) layer of silicon dioxide, followed by tantalum nitride, titanium-tungsten, and finally gold. In this manner, the layers which will be used to form the passivation/protection layer, the resistors, and the capacitor baseplates are formed.

6. The gold protective layer then is removed from the back surface, the photolithography is completed, the oxide is patterned, and the silicon again is etched to a depth of one-half of its thickness, using the above-described reflux system. In this manner, the backside vias are formed.

7. The back surface then is sputtered again with a thin film of gold. The front surface is patterned in a non-standard thickness of photoresist to expose the capacitor baseplates, the vias, and the bottom of the device recesses. The wafer then is electroplated with gold to a thickness of 4 microns.

8. Then, using a photolithographic mask, the tantalum nitride layer which is used to form the resistor elements is etched using reactive ion etching (RIE).

9. A PECVD layer of silicon nitride is deposited, photoresist coated, patterned, and etched to form the capacitor dielectric and the crossunder protection for the air bridges.

10. A two-step lithographic process follows in which a plating conductivity layer is deposited over a pre-patterned photoresist layer. A second resist layer then is put in place, and is patterned. The wafer then is electroplated. As a result, the capacitor top plates, inductors, and the resistor terminations are formed, as are the air bridges.

11. Finally, the wafer is mounted on a dicing medium, where it is diced into individual circuits, and given a final quality assurance inspection.

Figure 2:
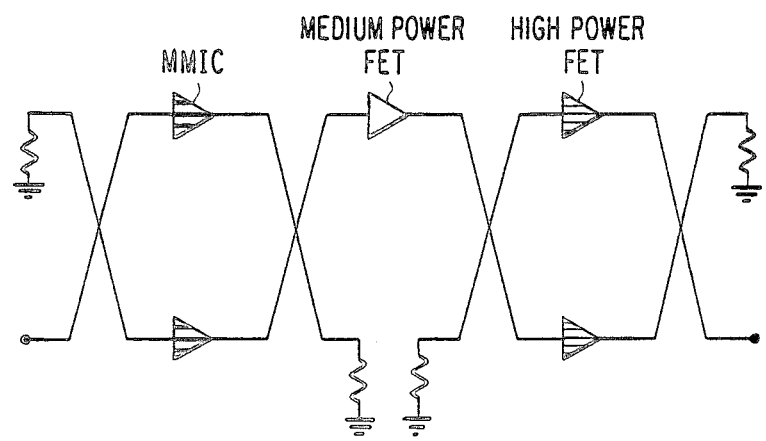
FIG. 2 shows a schematic of a three-stage power amplifier used in the invention.
Figure 3:
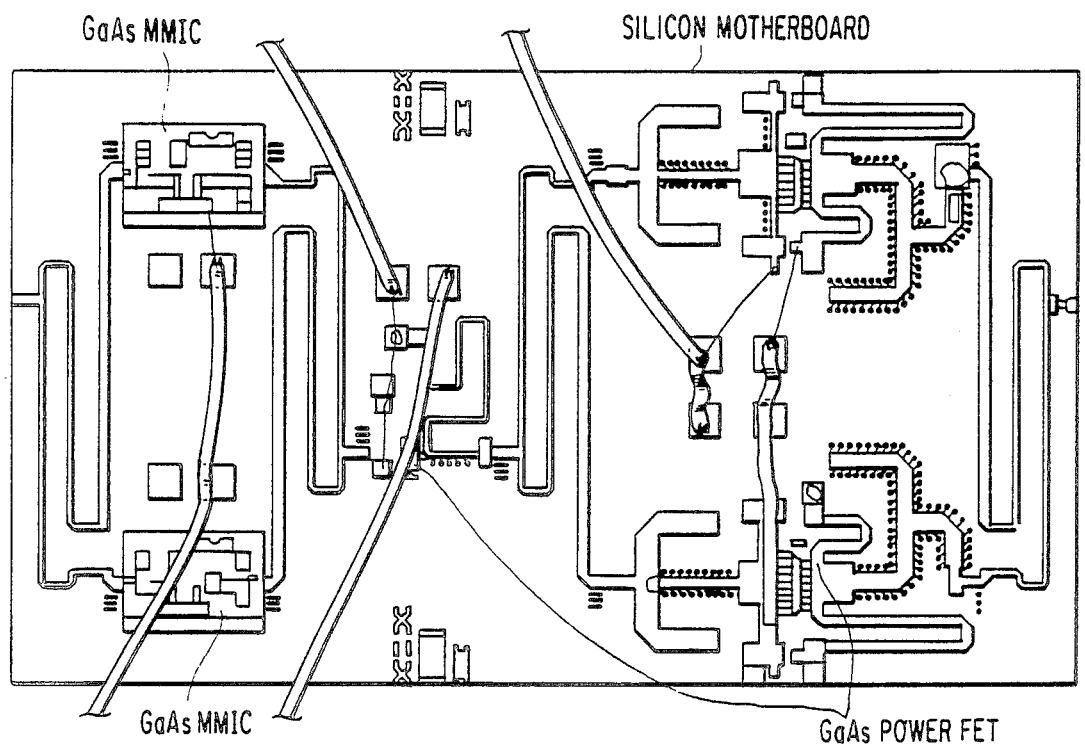
FIG. 3 is a photograph of a three-stage C-band power amplifier on a silicon motherboard, according to the present invention.

FIG. 2 shows a schematic of a C-band multi-stage power amplifier, and FIG. 3 shows a photograph of that amplifier. Looking at FIG. 2, the first stage consists of a pair of MMICs 110, 120 in a balanced configuration. The second and third stages use discrete power FETs with monolithic impedance matching on silicon. The input MMICs 110, 120 each have two well-vias, one at the input and one at the output. This also is shown in the cross-section of FIG. 1. The FETs also have two well-vias, but at the ends of the rectangular well, at right angles to the MMIC wells.

As shown in FIG. 3, offset Wilkinson power dividers are used, rather than quadrature couplers, to form first and third balanced stages. The output one watt amplifiers are operated at close to a class B mode for maximum efficiency, and include short circuits at the even harmonics.

Figure 4:
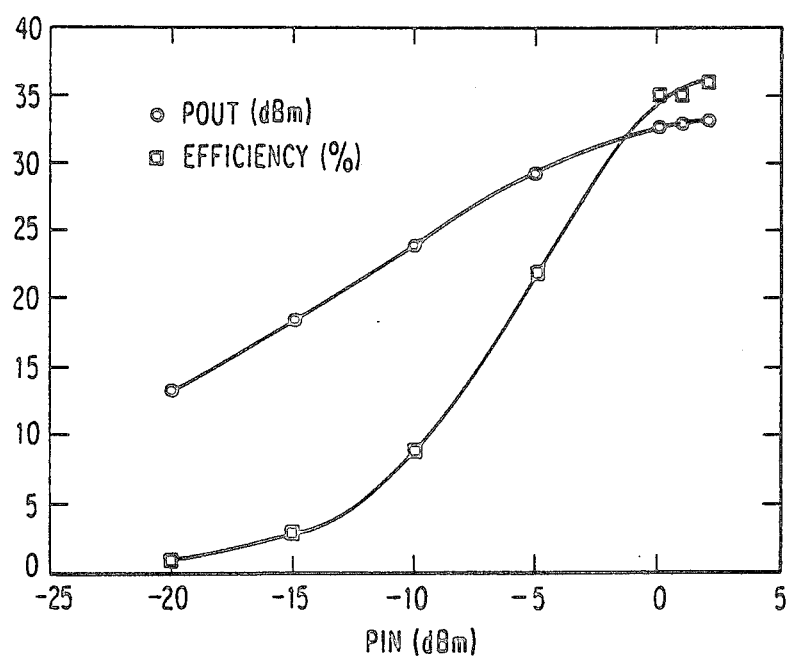
FIG. 4 is a graph showing measured performance of the three-stage SMB power amplifier.

FIG. 4 is a plot of the output power and efficiency of the SMB amplifier at the center of a 3.7 to 4.2 GHz design band as a function of input power. The output power and gain match closely the predicted values of 33 dBm and 33 dB, respectively. The measured efficiency is 36%.

Other elements incorporated onto the silicon motherboard include transmission lines 200; formation of capacitors 300 and resistors 400 has been described previously. The transmission line 200 is connected to MMICs 100 via bond wires 250. As mentioned above, not only microstrip, but also waveguide and finline transmission elements may be provided.

In comparison to an implementation of a three-stage amplifier using alumina substrates, requiring ten such substrates with patterned parallel plate capacitors, fabrication time for the inventive package using an SMB was found to be one-fourth to one-third of the time required for the alumina implementation. Part of the difference in results is achieved through the use of a single SMB versus multiple alumina substrates.

Also, it should be mentioned that in microwave applications such as those in which the MMIC packages of the present invention will be used, various types of control circuitry are necessary. These have been provided on separate substrates in the past, but by using a silicon motherboard, control circuitry such as microprocessors can be integrated on the motherboard as well.

While the invention has been described in detail above with reference to a preferred embodiment, various modifications within the scope and spirit of the invention will be apparent to people of working skill in this technological field. Thus, the invention should be considered as limited only by the scope of the appended claims.

What is claimed is:

1. A method of packaging gallium arsenide monolithic microwave integrated circuits (MMICs), comprising:
   (i) etching recesses in a first major surface of a silicon motherboard (SMB);
   (ii) etching vias at least from a second major surface of said SMB to a bottom of said recesses; and
   (iii) depositing said MMICs in said recesses; wherein said SMB comprises silicon having a resistivity of at least 8 kΩ cm and being operable to conduct energy at RF frequencies.

2. A method as claimed in claim 1, wherein said step (i) is achieved by anisotropic etching so that said recesses are tapered.

3. A method as claimed in claim 1, wherein said step (ii) further comprises the steps of etching one set of vias from said first major surface to a depth one-half the thickness of said SMB, and etching another set of vias from said second major surface to said depth one-half the thickness of said SMB.

4. A method as claimed in claim 1, wherein said step (ii) is achieved by etching a first set of vias from said second major surface to a point substantially halfway between said first and second major surfaces, and a second set of vias from said first major surface so as to meet at least some of said first set of vias, so as to provide openings extending through said SMB.

5. A method as claimed in claim 1, further comprising the step of providing metalization along sidewalls of said vias.

6. A method as claimed in claim 1, further comprising the step of performing automated wire bonding between said MMICs and other device elements on said SMB.

7. A method as claimed in claim 1, wherein said MMICs comprise transmit/receive modules and multistage amplifiers.

8. A method as claimed in claim 1, wherein said SMB comprises silicon having a <100> crystal orientation.

9. A method as claimed in claim 8, wherein said step (i) comprises the step of performing anisotropic etching of said silicon along a <111> plane.

10. A method as claimed in claim 1, wherein said SMB comprises silicon having a resistivity of at least 10 kΩ cm.

11. A method as claimed in claim 10, wherein said silicon is ultra high purity, uncompensated silicon.

12. A method of packaging gallium arsenide monolithic microwave integrated circuits (MMICs), comprising:
- (i) thermally oxidizing first and second major surfaces of an ultra high purity, uncompensated silicon substrate at a temperature greater than $>1000°$ C. in a wet atmosphere to provide an oxide layer;
- (ii) sputtering a gold film onto said second major surface of said substrate;
- (iii) etching said first major surface using photolithographic techniques, to open up selected areas on said first major surface;
- (iv) anisotropically etching said selected areas of said first major surface to form device recesses and vias, by placing said substrate in a solution of KOH and water at a temperature of approximately 85° C. in a reflux etching system;
- (v) depositing a thin layer of amorphous silicon on said first major surface, and covering said thin layer of amorphous silicon with a plasma enhanced chemical vapor deposited (PECVD) layer of silicon dioxide, followed by tantalum nitride, titanium-tungsten, and gold in that order;
- (vi) removing said gold layer from said second major surface, and forming additional vias in said second major surface by etching said silicon on a side of said second major surface to a depth of one-half of the thickness of the substrate;
- (vii) sputtering another thin film of gold on said second major surface, patterning said first major surface with photoresist to expose baseplates of capacitors, said additional vias, and bottoms of device recesses, followed by electroplating said substrate with gold;
- (viii) reactive ion etching said tantalum nitride layer;
- (ix) depositing a PECVD layer of silicon nitride which then is photoresist coated, patterned, and etched to form capacitor dielectric and cross-protection for air bridges; and
- (x) depositing a plating conductivity layer over a pre-patterned photoresist layer, and placing and patterning a second resist layer, followed by electroplating of said substrate, so as to form the capacitor top plates, inductors, resistor terminations, and air bridges.

13. A method as claimed in claim 12, wherein said step (iv) comprises the step of etching said device recesses and vias to a depth of one-half the thickness of said substrate.

14. A method as claimed in claim 12, wherein said ultra high purity, uncompensated silicon has a resistivity of at least 8 k$\Omega$-cm, and not greater than 25 k$\Omega$-cm.

15. A method as claimed in claim 12, wherein said ultra high purity, uncompensated silicon has a $<100>$ crystal orientation.

* * * * *